United States Patent
Xue et al.

(10) Patent No.: US 8,076,183 B2
(45) Date of Patent: Dec. 13, 2011

(54) METHOD OF ATTACHING AN INTERCONNECTION PLATE TO A SEMICONDUCTOR DIE WITHIN A LEADFRAME PACKAGE

(75) Inventors: Yan Xun Xue, Los Gatos, CA (US); Jun Lu, San Jose, CA (US); Le Shi, Shanghai (CN); Liang Zhao, Shanghai (CN)

(73) Assignee: Alpha and Omega Semiconductor, Inc., Sunnyvale, CA (US)

( * ) Notice: Subject to any disclaimer, the term of this patent is extended or adjusted under 35 U.S.C. 154(b) by 65 days.

(21) Appl. No.: 12/606,290

(22) Filed: Oct. 27, 2009

(65) Prior Publication Data
US 2011/0095409 A1    Apr. 28, 2011

(51) Int. Cl.
H01L 21/50    (2006.01)
H01L 21/48    (2006.01)
H01L 21/44    (2006.01)

(52) U.S. Cl. ........ 438/123; 438/106; 438/110; 438/111; 257/666; 257/670; 257/676; 257/692; 257/E23.047

(58) Field of Classification Search .................. None
See application file for complete search history.

(56) References Cited

U.S. PATENT DOCUMENTS

| | | | | |
|---|---|---|---|---|
| 5,889,318 A * | 3/1999 | Corisis | ........................... | 257/670 |
| 6,075,283 A * | 6/2000 | Kinsman et al. | ............... | 257/676 |
| 6,225,683 B1 * | 5/2001 | Yalamanchili et al. | ........ | 257/666 |
| 6,635,138 B1 * | 10/2003 | Choi | ............................. | 156/230 |
| 6,815,806 B1 * | 11/2004 | Awad et al. | ................... | 257/666 |
| 7,239,009 B2 * | 7/2007 | Kiyohara | ....................... | 257/666 |

* cited by examiner

Primary Examiner — Zandra Smith
Assistant Examiner — Khanh Duong
(74) Attorney, Agent, or Firm — Chien-Hwa Tsao; CH Emily LLC

(57) ABSTRACT

A method is disclosed for attaching an interconnection plate to semiconductor die within leadframe package. A base leadframe is provided with die pad for attaching semiconductor die. An interconnection plate is provided for attachment to the base leadframe and semiconductor die. Add a base registration feature onto base leadframe and a plate registration feature onto interconnection plate with the registration features designed to match each other such that, upon approach of the interconnection plate to base leadframe, the two registration features would engage and guide each other causing concomitant self-aligned attachment of the interconnection plate to base leadframe. Next, the interconnection plate is brought into close approach to base leadframe to engage and lock plate registration feature to base registration feature hence completing attachment of the interconnection plate to semiconductor die and forming a leadframe package.

21 Claims, 11 Drawing Sheets

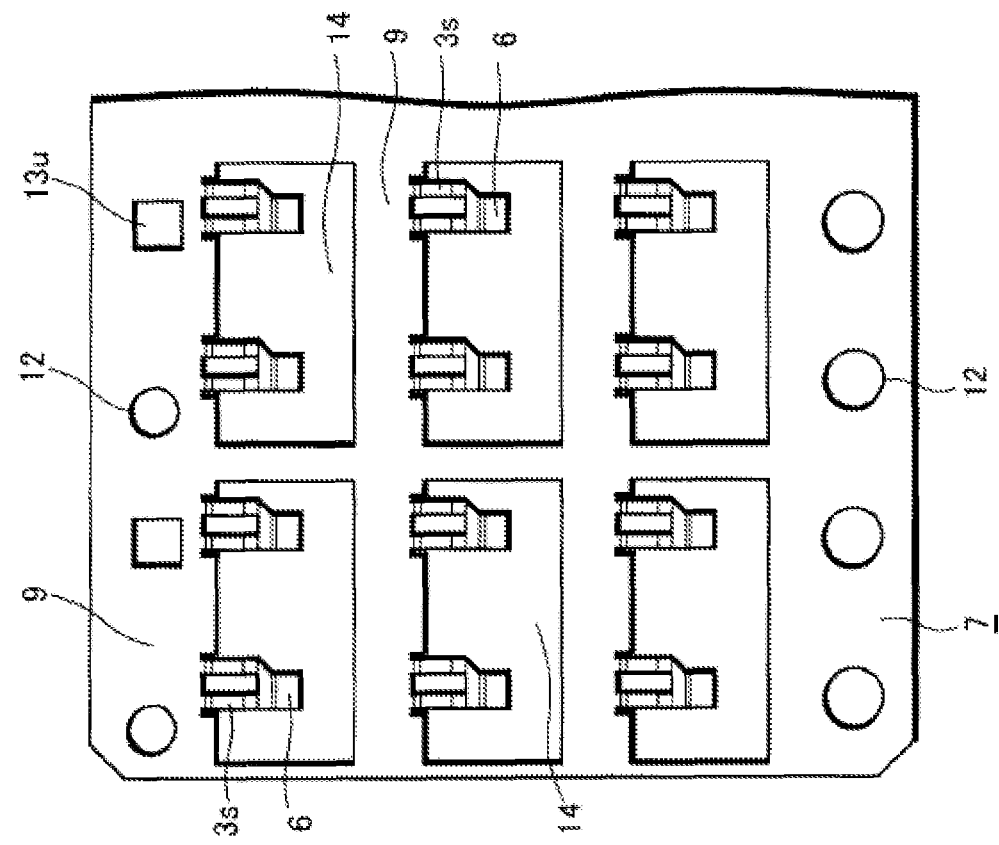
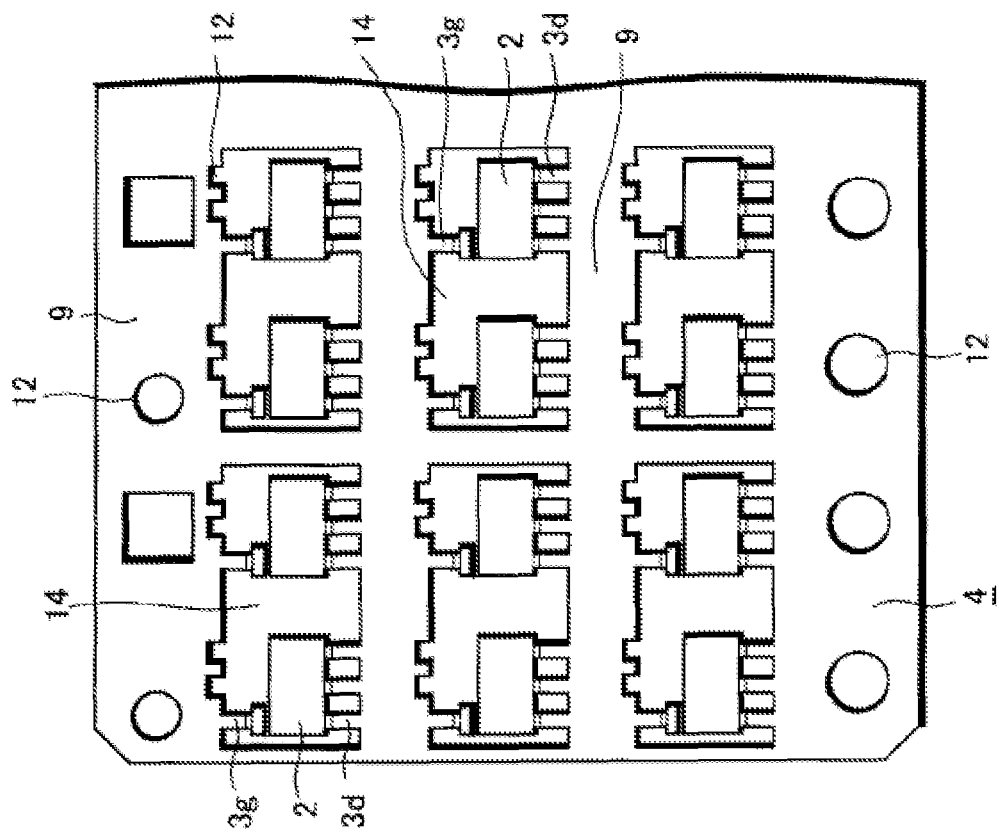
Fig. 23 Prior Art

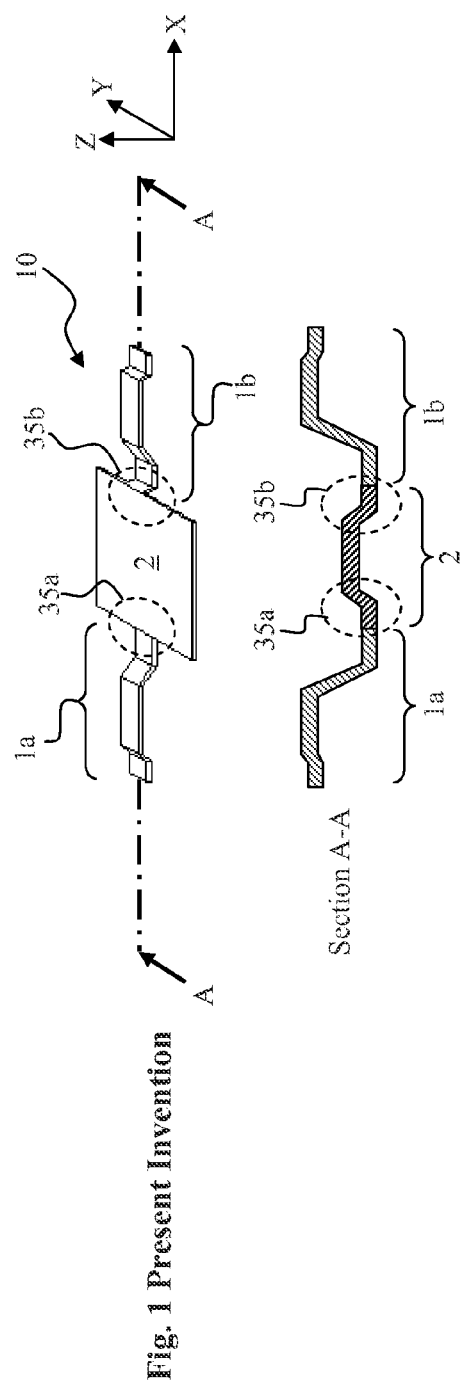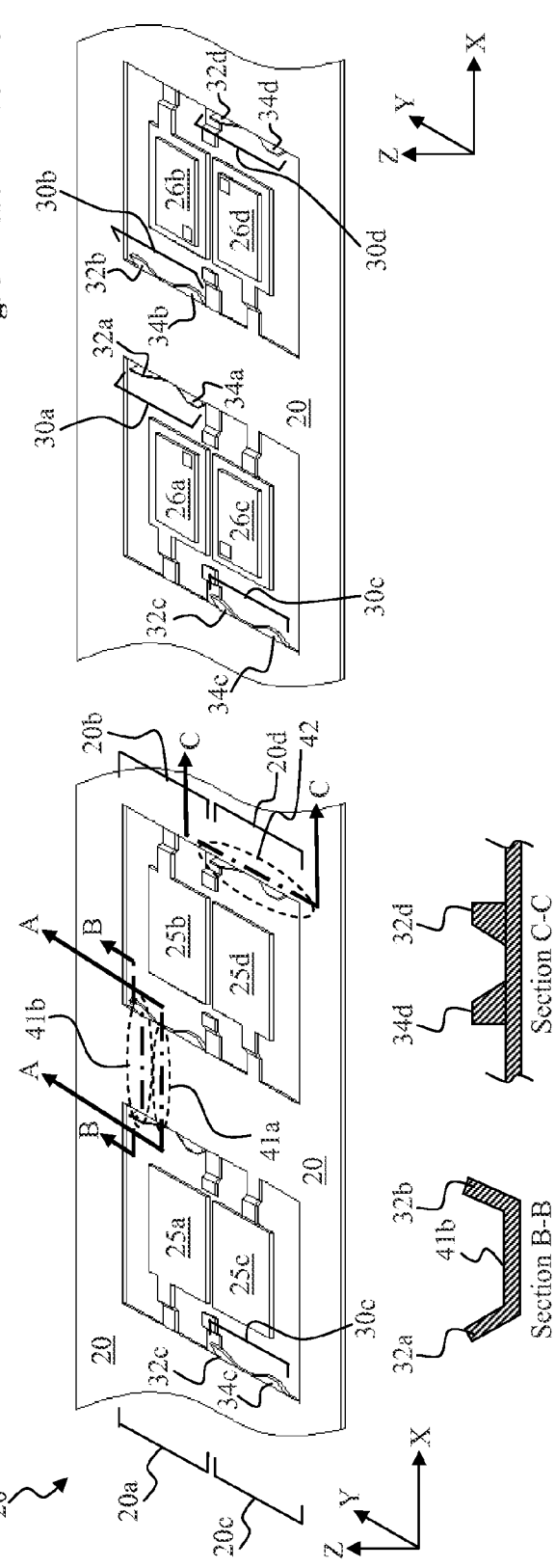

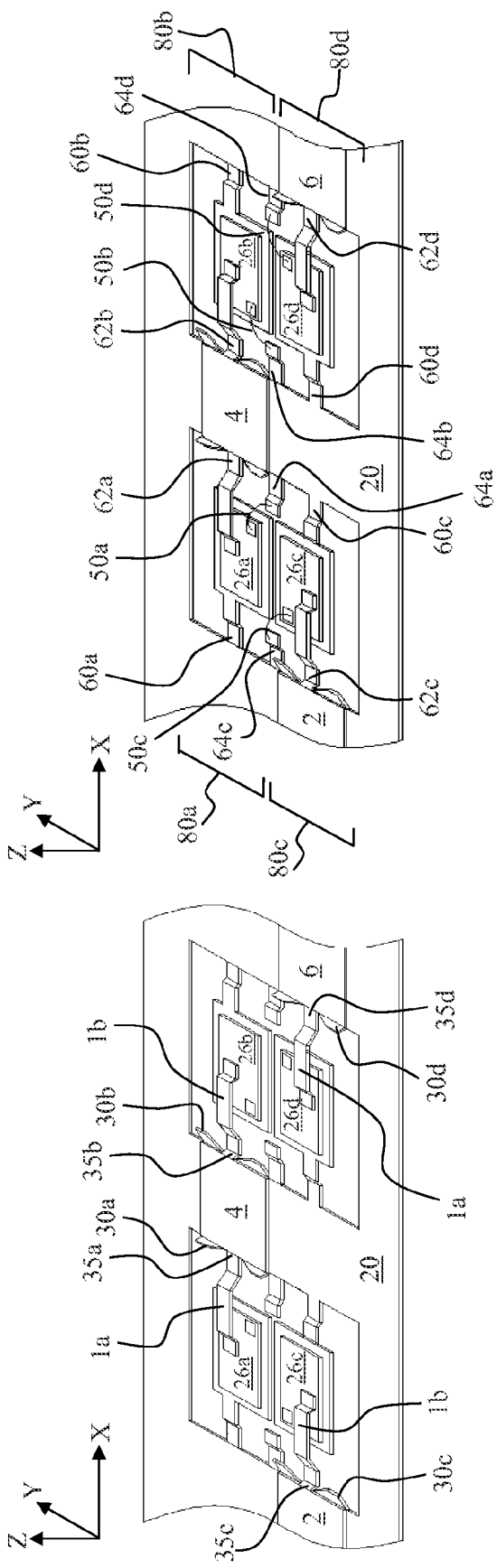
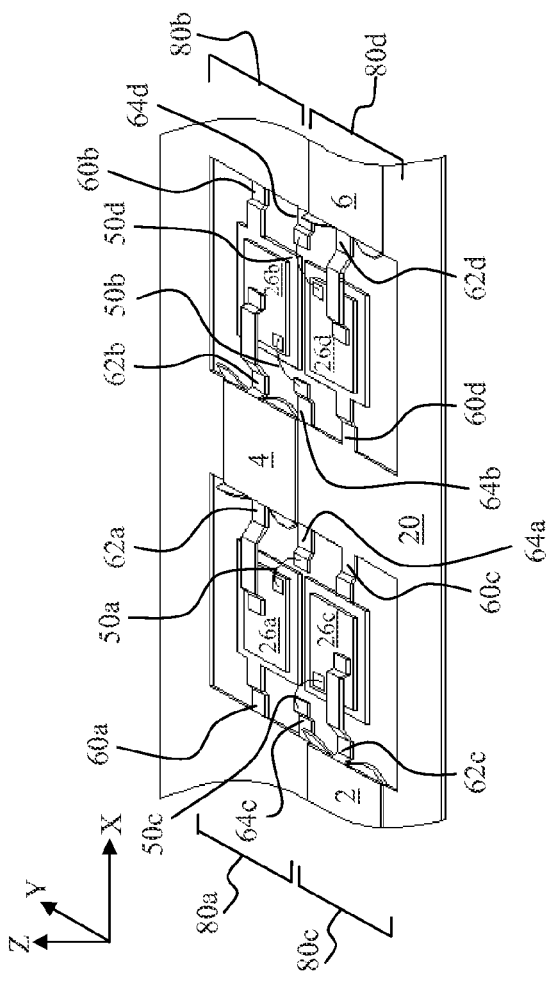
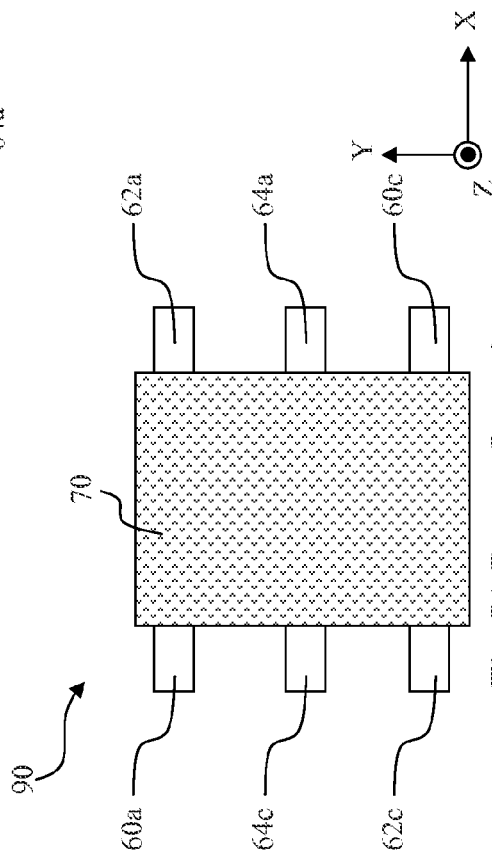

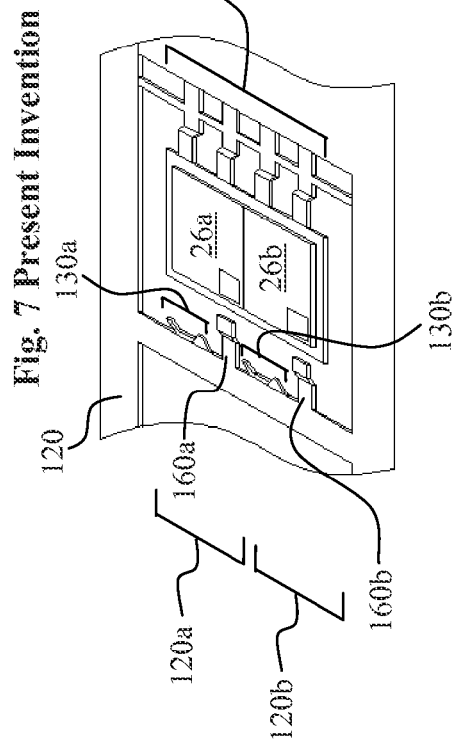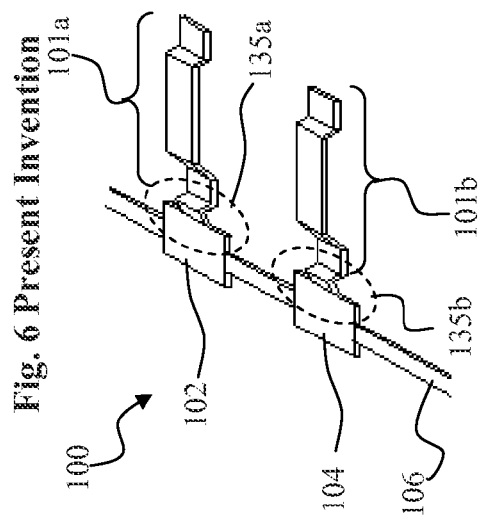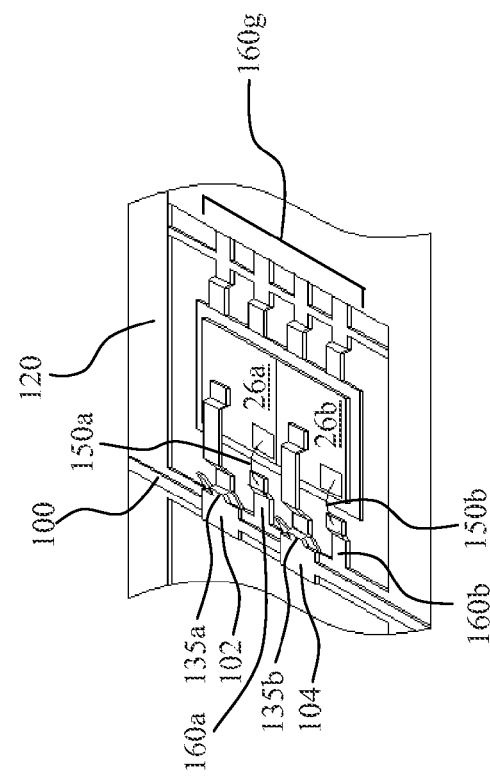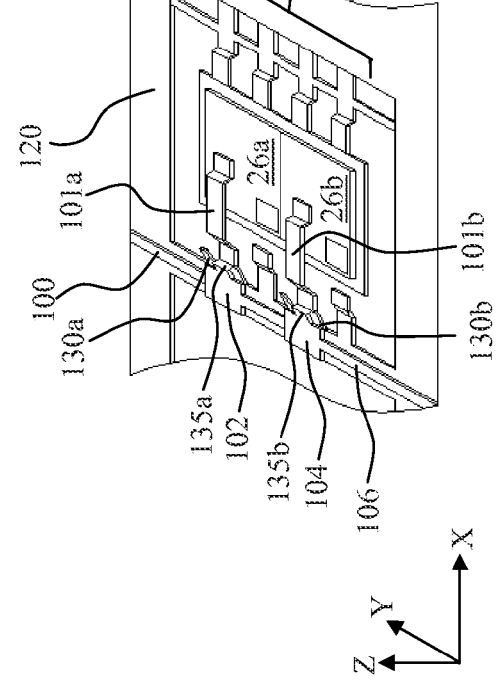

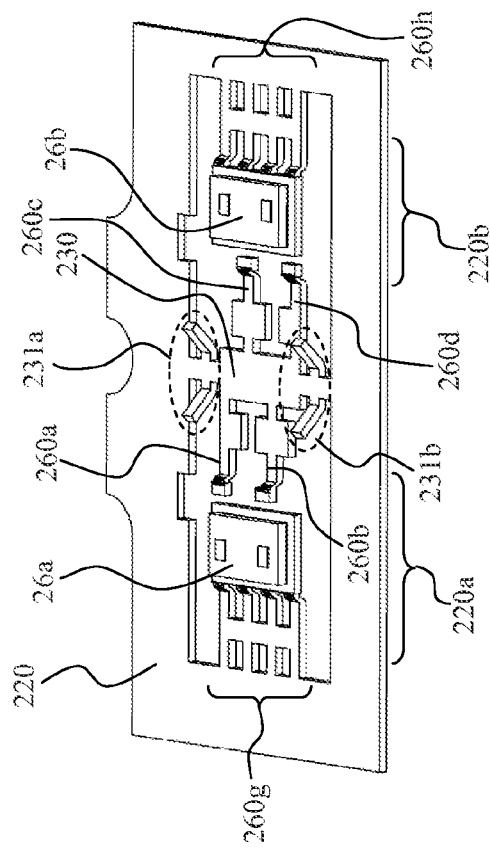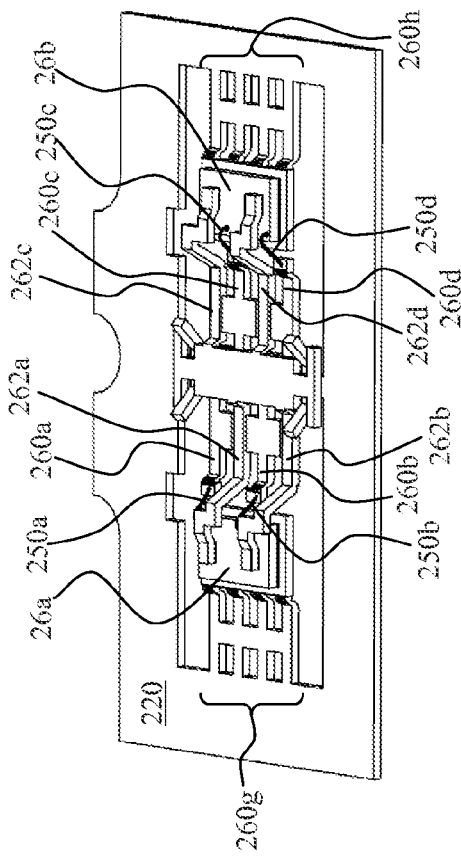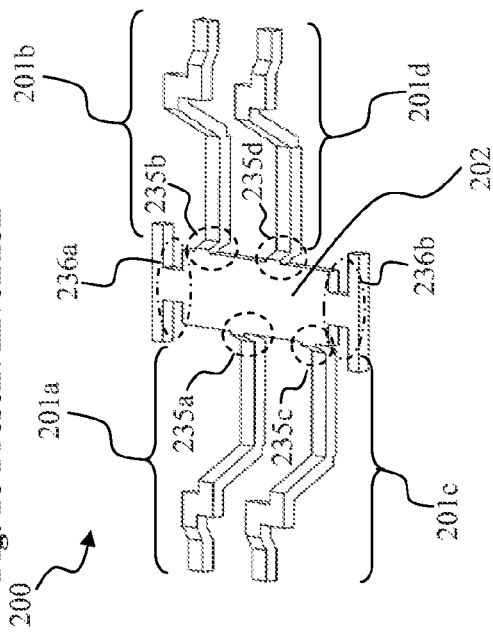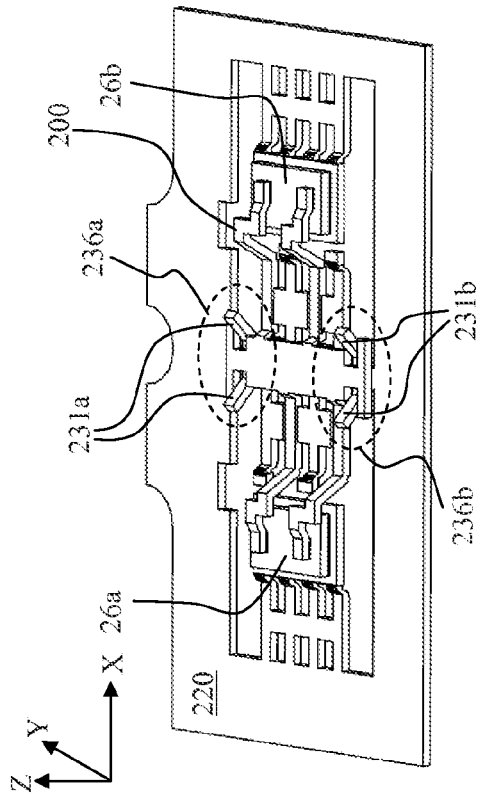

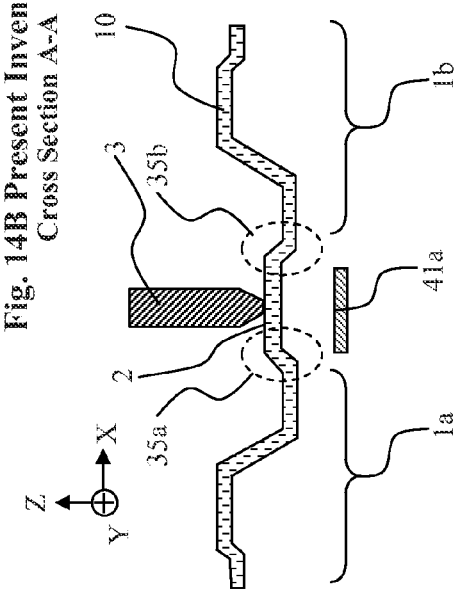
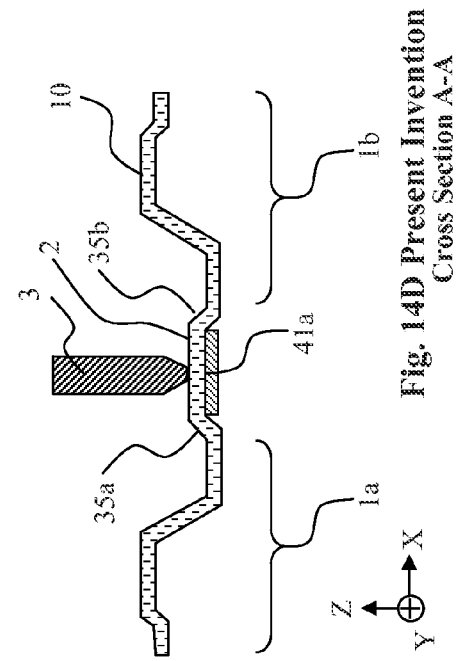
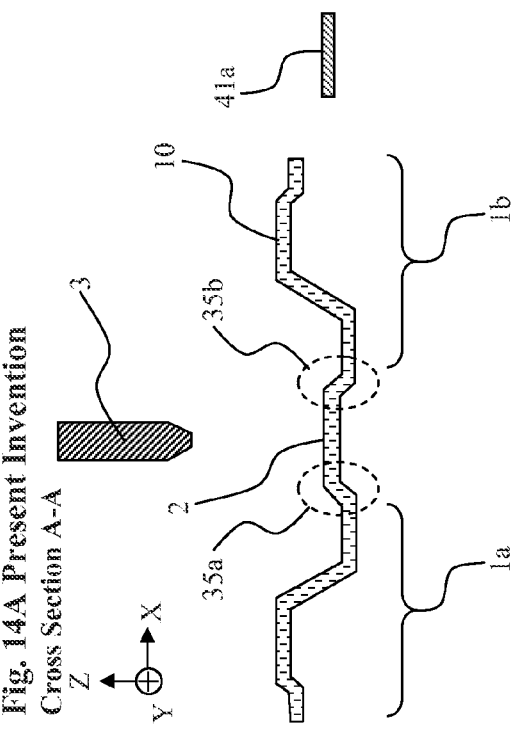
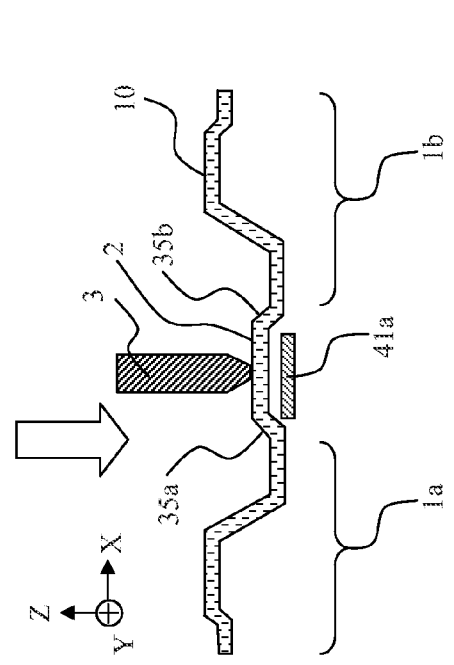

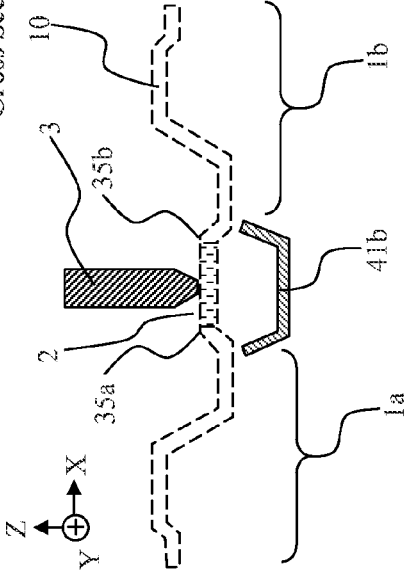
Fig. 15A Present Invention Cross Section B-B
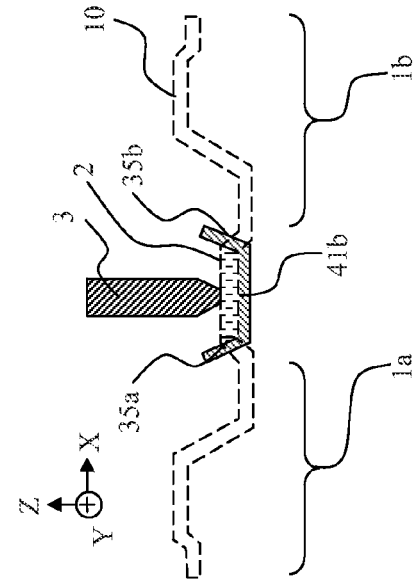
Fig. 15B Present Invention Cross Section B-B
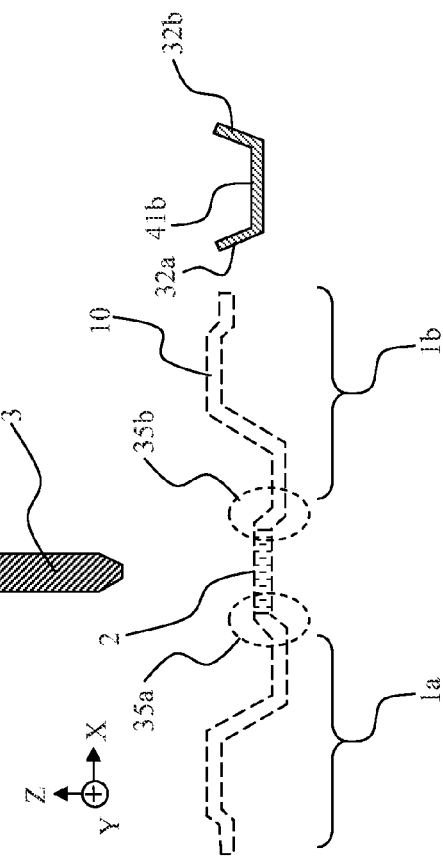
Fig. 15C Present Invention Cross Section B-B
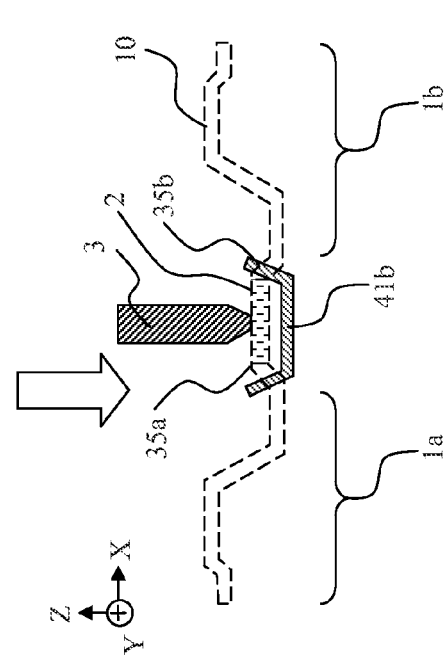
Fig. 15D Present Invention Cross Section B-B

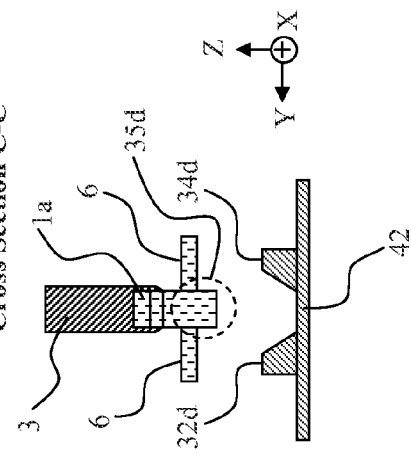
Fig. 16A Present Invention Cross Section C-C
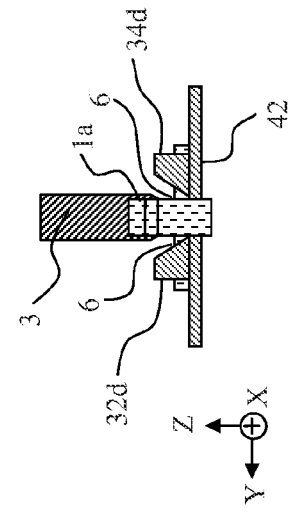
Fig. 16B Present Invention Cross Section C-C
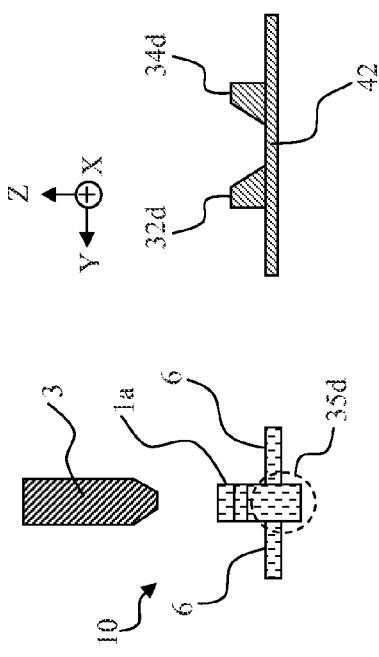
Fig. 16C Present Invention Cross Section C-C
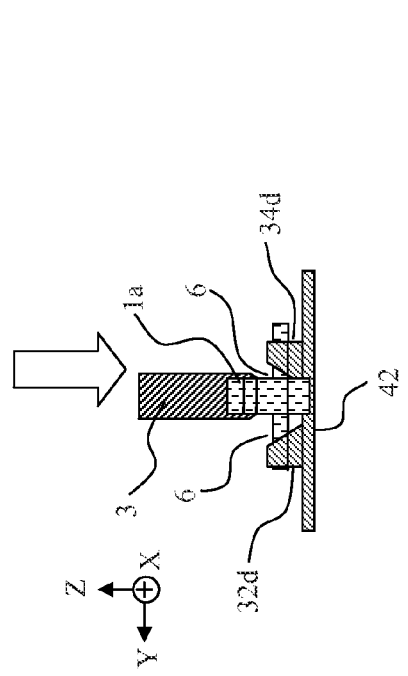
Fig. 16D Present Invention Cross Section C-C

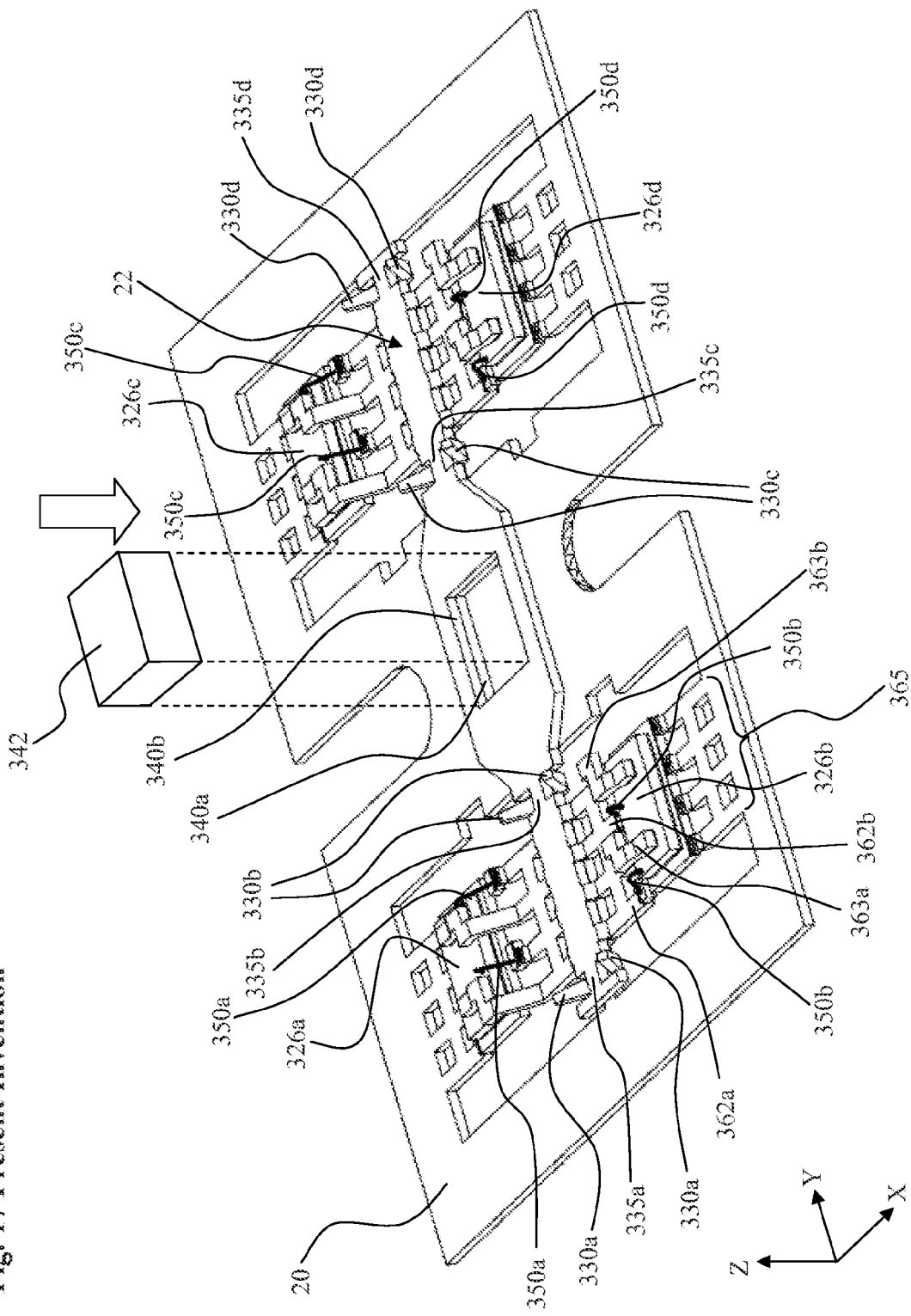
Fig. 17 Present Invention

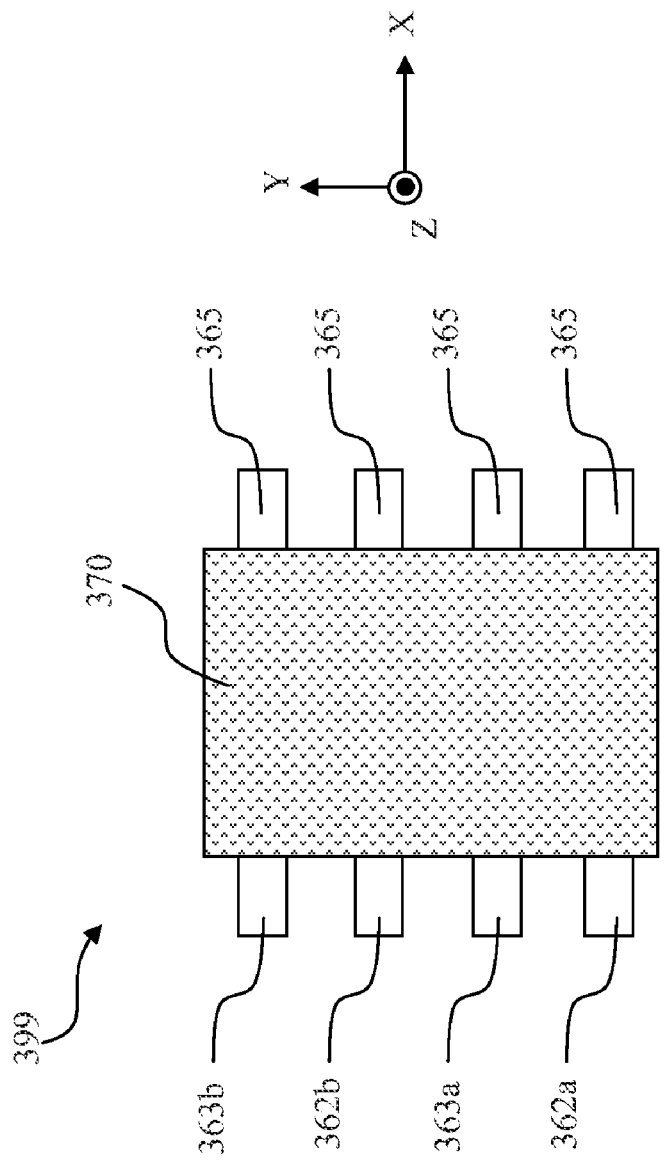

METHOD OF ATTACHING AN INTERCONNECTION PLATE TO A SEMICONDUCTOR DIE WITHIN A LEADFRAME PACKAGE

CROSS REFERENCE TO RELATED APPLICATIONS

This application is related to the following commonly assigned patent applications:

U.S. application Ser. No. 11/799,467 entitled "SEMICONDUCTOR PACKAGE HAVING DIMPLED PLATE INTERCONNECTIONS" by Ming Sun et al, publication# US20070290336, hereafter referred to as U.S. application Ser. No. 11/799,467

US Patent Application Publication No. 20080087992 entitled "Semiconductor package having a bridged plate interconnection" by Shi Lei et al, hereafter referred to as US 20080087992

Commonly assigned U.S. patent application Ser. No. 12/130,663 entitled "CONDUCTIVE CLIP FOR SEMICONDUCTOR DEVICE PACKAGE" by Shi Lei et al, hereafter referred to as U.S. application Ser. No. 12/130,663

Commonly assigned U.S. patent application Ser. No. 12/237,953 entitled "Top Exposed Clip with Window Array" by Shi Lei et al, hereafter referred to as U.S. application Ser. No. 12/237,953

Commonly assigned U.S. patent application Ser. No. 12/326,065 entitled "Top-side Cooled Semiconductor Package with Stacked Interconnection Plates and Method" by Kai Liu et al, hereafter referred to as U.S. application Ser. No. 12/326,065 whose content is incorporated herein by reference for any and all purposes.

FIELD OF INVENTION

This invention relates generally to the field of electronic system packaging. More specifically, the present invention is directed to packaging method of semiconductor dies.

BACKGROUND OF THE INVENTION

Packaging of power semiconductor dies of ever shrinking size and with ever reducing parasitic impedance has been driven by the consumer market on an ongoing basis. The following briefly reviews some related works.

FIG. 21 illustrates a prior art wherein two MOSFET semiconductor dies are packaged each with bond wires connected to its source and gate electrodes. While the associated assembly process is simple, the number of bond wires per package is limited by the package size owing to the significant size of wire bonding tools and technical constraints of the wire bonds—for example, bond wires should not cross each other. Additionally, the small cross section of bonding wires causes high connecting impedances (resistance and inductance) that in turn lower device current rating and can sometimes limit device operating frequency as well.

In U.S. Pat. No. 6,040,626 entitled "Semiconductor package" granted on Mar. 21, 2000 by Cheah et al, as illustrated in FIG. 22, clip bonding for source electrical connection was described. Semiconductor package 110 includes a bottom plate portion 13 and terminals 12a, 12b. The semiconductor package 110 also includes a housing 22 formed from a moldable material. A beam portion 34 is integrally formed into one flowing member which extends from one lateral edge of a plate portion 30 and terminates at terminals 12b. A metalized region 19 defines a gate of a MOSFET die 16. The semiconductor die 16 includes a metalized region 18 defining a connection area for a top surface of the semiconductor die 16. The metalized region 19 is electrically coupled to one terminal 12b via wire bond 20. Thus, U.S. Pat. No. 6,040,626 employs a mixed connection to the MOSFET die 16 top surface, namely, a low resistance plate portion 30 for connecting to the source and a wire bond 20 for connecting to the gate 19. A gate runner (or bus) 19a couples the gate metalized region 19 to the source areas of the surface of the die 16. It is preferred that the plate portion 30 extend laterally beyond outermost portions of the gate runner 19a. It is also preferable that the plate portion 30 extends beyond and cover as much of the gate runner 19a as possible. This ensures that improved performance is achieved. While clip bonding, owing to its much larger cross section, offers lower connecting impedances hence high current rating and possibly high device operating frequency as well, its application to small package sizes is difficult as two internal connections are required per clip and small clips are hard to handle, align and position during the packaging process.

In U.S. Pat. No. 6,689,642 entitled "Semiconductor device and manufacturing method thereof" granted on Feb. 10, 2004 by Fukuda, as illustrated in FIG. 23, a dual lead frame structure and assembly method for power MOSFET were described for reducing its on-state resistance and improving its production efficiency. The semiconductor package includes a lower frame 4 having a header 2 for fixing a semiconductor chip and corresponding external leads 3d, 3g, a semiconductor chip fixed on the header, an upper frame 7 having a connection electrode 6 fixed on a current passage electrode 5 formed on the top face of the semiconductor chip and the corresponding leads 3s, and a resin mold. This two-frame configuration provides extremely low on-state resistance and good production efficiency. The lower frame 4 itself is punched out from a copper material. The lower frame 4 includes a header 2 located in the center of the lower frame 4, three external leads 3d combined with the header 2 as one unit and extending from the header 2 to the outer frame 9, and an external lead 3g for another electrode with one end being close to the header 2 and another end being connected to the outer frame 9. Round index holes 12 are formed at both side edges of the outer frame 9 of the lower frame 4 with a constant interval for each side. These index holes are used for the positioning and the pitch-by-pitch transportation in the procedures of the manufacturing method. A square position-determining index hole for positioning the upper and lower frames 4, 7 is formed next to each round index hole 12 along the top side edge of the outer frame 9 of the lower frame. The round index holes 12 are formed at the locations corresponding to the lines connecting the centers of the headers 2 with a constant interval along the bottom side edge of the outer frame 9 of the lower frame 4. Two headers 2 and the corresponding external leads 3d are formed in one cell area 14 surrounded by the outer frame 9. The lower frame 4 has a 3.times.20 matrix of cell areas 14 between the top and bottom rows of index holes 12. Thus, one lower frame 4 has 60 cell areas and 120 headers 2 for fixing the semiconductor chips. The semiconductor chips are then fixed on each of the headers 2 in the cell areas 14 of the lower frame 4 by die bonding. That is, the semiconductor chips, such as power MOSFET bare chips, are fixed on the headers 2 of the lower frame 4 through the pre-form made of solder or silver paste using a die bonding instrument. During this procedure, the index holes 12 in the top and bottom side edges are used for the positioning of the headers 2 and for transporting the lower frame 4 by one pitch at a time. At the end, all the headers 2 of the lower frame 4 have a semiconductor chip fixed on themselves. Round index holes 12 are also formed at both side edges of the outer frame 9 of the upper frame 7 with a constant interval for each side, as in the case with the lower frame 4. These index holes are used for the positioning and the pitch-by-pitch transportation in the manufacturing method. A square position-determining index hole for positioning the upper and lower frames 4, 7 is formed next to each round index hole 12 along the top side edge of the outer frame 9 of the upper frame 7. The two position-determining index holes have an identical size and shape. Two connection electrodes 6 and the corresponding external leads 3s are formed in one cell area 14 surrounded by the outer frame 9. While the dual lead frame structure also offers high device current rating and lower connecting impedances, it entails a complicated assembly process. The assembly process either requires special machinery, or manual assembly, which greatly increases the cost and/or reduces the throughput.

U.S. application Ser. No. 11/799,467 disclosed a semiconductor package having dimpled plate interconnections. A source plate includes a plurality of dimples formed thereon. The dimples are concave with respect to a top surface of the source plate and include a through hole having an opening formed beyond a plane of a bottom surface thereof. Similarly, a gate plate includes a dimple that is concave with respect to a top surface of the gate plate and includes a through hole.

In US Patent Application 20080087992 entitled "Semiconductor package having a bridged plate interconnection" by Shi Lei et al, hereafter referred to as US 20080087992, a semiconductor package with a bridged source plate interconnection is disclosed for packaging a semiconductor die. A semiconductor package is illustrated that includes a leadframe having a die pad, a source contact portion and a gate contact portion. A bridged source plate includes a metal plate stamped or punched to form a bridge portion, valley portions on either side of the bridge portion, plane portions on either side of the valley portions and the bridge portion, and a connection portion depending from one of the plane portions.

In a commonly assigned U.S. patent application Ser. No. 12/130,663 with filing date May 30, 2008 and entitled "CONDUCTIVE CLIP FOR SEMICONDUCTOR DEVICE PACKAGE" by Shi Lei et al, hereafter referred to as U.S. application Ser. No. 12/130,663, a semiconductor device package with a conductive clip having separate parallel conductive fingers electrically connected to each other by conductive bridges is disclosed. A semiconductor device package is illustrated with its gate bond wire replaced with a gate clip. The device package includes a fused lead frame, a MOS device having top source, top gate and bottom drain located on top of the lead frame and a clip having separate parallel conductive fingers electrically connected to each other by conductive bridges. The clip is electrically bonded to the top source of the MOS device only at the bridges.

In a commonly assigned U.S. patent application Ser. No. 12/237,953 with filing date Sep. 24, 2008 and entitled "Top Exposed Clip with Window Array" by Shi Lei et al, hereafter referred to as U.S. application Ser. No. 12/237,953, a semiconductor device package with single stage clips is disclosed. Each single stage clip includes a metal sheet having arrays of windows thereon. The semiconductor device package includes a fused lead frame and a semiconductor device having contact regions on top and bottom surfaces. The semiconductor device may be a vertical metal oxide semiconductor (MOS) device having a top source contact, a top gate contact and a bottom drain contact. The semiconductor device is located on top of the lead frame with the bottom drain contact facing and making electrical contact with the main portion of the lead frame. The lead frame may be fused or non-fused. As an embodiment of U.S. application Ser. No. 12/237,953, the semiconductor device package includes single stage clips, which include two separate metal sheets having arrays of windows respectively.

In a commonly assigned U.S. patent application Ser. No. 12/326,065 entitled "Top-side Cooled Semiconductor Package with Stacked Interconnection Plates and Method" by Kai Liu et al, hereafter referred to as U.S. application Ser. No. 12/326,065, a top-side cooled semiconductor package with stacked interconnection plate is disclosed that includes a circuit substrate with terminal leads, a semiconductor die atop the circuit substrate, a low thermal resistance intimate interconnection plate for bonding and interconnecting a top contact area of the semiconductor die with the circuit substrate, a low thermal resistance stacked interconnection plate atop the intimate interconnection plate for top-side cooling, a molding encapsulant for encapsulating the package except for exposing a top surface of the stacked interconnection plate to maintain effective top-side cooling. The top portion of the stacked interconnection plate can include a peripheral overhang above the intimate interconnection plate. The peripheral overhang allows for a maximized exposed top surface area for heat dissipation independent of otherwise areal constraints applicable to the intimate interconnection plate. The stacked interconnection plate can be partially etched or three dimensionally formed to create the peripheral overhang.

In review of the above related works and the ongoing market demand of packaging power semiconductor dies with ever shrinking size and ever reducing parasitic impedance, it is desirable to further improve the fabrication and assembly process for packaging power semiconductor dies using interconnection plates.

SUMMARY OF THE INVENTION

A method is proposed for attaching an elevation-adaptive interconnection plate to a semiconductor die within a leadframe package. The package has numerous terminal leads for external electrical connection to it. The method includes:

a) Provide a base leadframe with terminal leads and a die pad on it for attaching the semiconductor die. Also, provide an interconnection plate for attachment to the base leadframe and the semiconductor die.

b) Add a base registration feature onto the base leadframe and add a plate registration feature onto the interconnection plate. The base registration feature and the plate registration feature are shaped and sized to match each other such that, upon an approach of the interconnection plate to the base leadframe with the semiconductor die attached thereon, the plate registration feature and the base registration feature would engage and guide each other causing a concomitant self-aligned attachment of the interconnection plate to the base leadframe and the semiconductor die.

c) Attach and bond the semiconductor die atop the die pad.

d) Bring the interconnection plate into close approach to the base leadframe to engage and lock plate registration feature and base registration feature to each other hence completing attachment of the interconnection plate to the semiconductor die thus forming a leadframe package. Bond the interconnection plate to the semiconductor die. A molding encapsulant is then formed over the package in progress for passivation. Both base registration feature and plate registration feature can then be cut away from the leadframe package.

Multiple interconnection plate units may be thus individually aligned and attached to a base leadframe comprising several leadframe units.

In a more detailed embodiment, certain electrodes of the semiconductor die can instead be wire bonded to leads where it is not necessary to use interconnection plates.

As a refinement, the plate registration feature can be bonded onto the base registration feature with, for example, a solder joint.

To facilitate handling of the interconnection plate for a close approach to the base leadframe, a handling access area can be provided on it of sufficient size such that the interconnection plate can be handled with the tip of a pick up tool, for example a vacuum pick up tool, engaging the handling access area.

Under situations where the interconnection plate itself is too small to accommodate a handling access area, a separate handling access area of sufficient size can be appended to the interconnection plate such that the small sized interconnection plate can be handled with the tip of a pick up tool engaging the separate handling access area.

Under situations where the leadframe package is batch fabricated in multiple units on a common carrier frame, the appended separate handling access area can be shared among multiple leadframe package units on the common carrier frame.

In a particular embodiment, the appended separate handling access area is shared among two leadframe package units by orienting the two leadframe packages so they oppose each other referencing the handling access area.

Like the base registration feature and the plate registration feature, the separate handling access area can be cut away from the leadframe package after encapsulation.

As a refinement for engaging and locking plate registration feature and base registration feature to each other, a base registration hole and a plate registration hole can be made respectively on the base leadframe and the interconnection plate such that, upon attachment of the interconnection plate to the base leadframe, the two registration holes would line up with each other. Upon attachment of the interconnection plate to the base leadframe, a locking pin can then be inserted into the two registration holes to further lock the attachment in place.

As another refinement, both base leadframe and interconnection plate can be configured so that the base leadframe provides a first portion and the interconnection plate provides a second portion of the terminal leads.

These aspects of the present invention and their numerous embodiments are further made apparent, in the remainder of the present description, to those of ordinary skill in the art.

BRIEF DESCRIPTION OF THE DRAWINGS

In order to more fully describe numerous embodiments of the present invention, reference is made to the accompanying drawings. However, these drawings are not to be considered limitations in the scope of the invention, but are merely illustrative.

FIG. 23 illustrates a third prior art of dual lead frame semiconductor device and associated assembly method for power MOSFET;

FIG. 1 illustrates dual interconnection plates of the present invention with plate registration features;

FIG. 2, FIG. 3, FIG. 4, FIG. 5 and FIG. 5A illustrate a present invention batch assembly process for four leadframe packages using a base leadframe carrier frame and a number of staggered dual interconnection plates;

FIG. 6 illustrates an alternative dual interconnection plates of the present invention wherein each interconnection plate member is appended with its own handling access area;

FIG. 7 through FIG. 9 illustrate a present invention batch assembly process for dual chip leadframe packages using a base leadframe carrier frame and the alternative dual interconnection plates of FIG. 6 with additional wire bonds;

FIG. 10 illustrates a quad interconnection plates of the present invention wherein a common handling access area is shared among four plate segments;

FIG. 11 through FIG. 13 illustrate a present invention batch assembly process for two single chip leadframe packages using a base leadframe carrier frame and the quad interconnection plates with additional wire bonds;

FIG. 14A through FIG. 14D illustrate a process of self-aligned attachment of a dual interconnection plates to a base registration feature along a first cross section;

FIG. 15A through FIG. 15D illustrate a process of self-aligned attachment of a dual interconnection plates to a base registration feature along a second cross section;

FIG. 16A through FIG. 16D illustrate a process of self-aligned attachment of a dual interconnection plates to a base registration feature along a third cross section;

FIG. 17 illustrates an embodiment under the present invention wherein a locking pin is inserted into two premade registration holes located respectively in a base leadframe carrier frame and a interconnection plate carrier frame to further lock the attachment in place; and FIG. 17A is a top view of a singulated package from FIG. 17.

DETAILED DESCRIPTION OF SPECIFIC EMBODIMENTS

Figure 22:
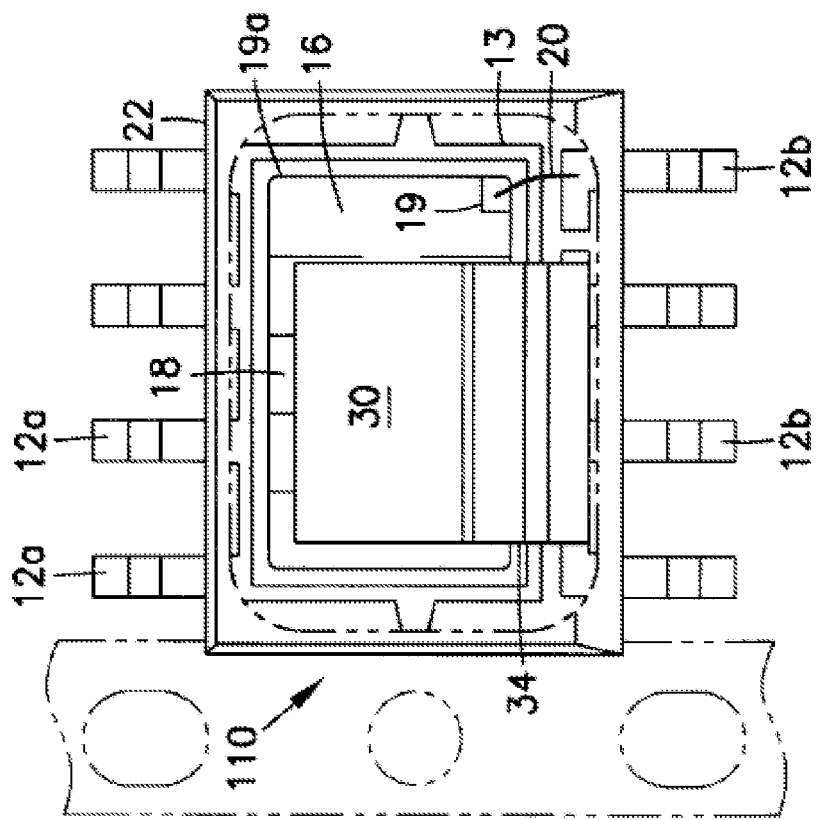
FIG. 22 illustrates another prior art using clip bonding for source electrical connection.
Figure 21:
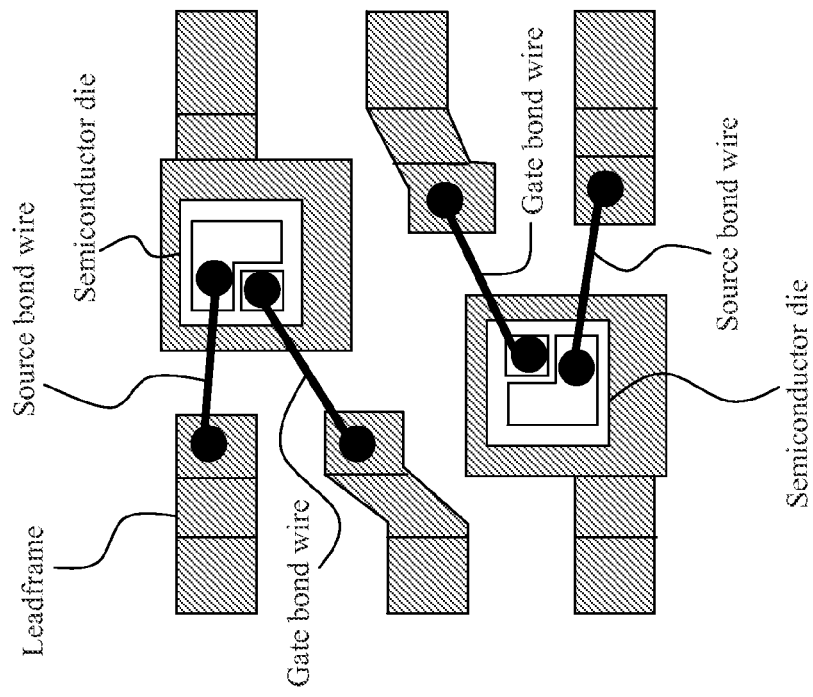
FIG. 21 illustrates a prior art wherein MOSFET semiconductor dies are packaged with wire bonds connected to its source and gate electrodes.

The description above and below plus the drawings contained herein merely focus on one or more currently preferred embodiments of the present invention and also describe some exemplary optional features and/or alternative embodiments. The description and drawings are presented for the purpose of illustration and, as such, are not limitations of the present invention. Thus, those of ordinary skill in the art would readily recognize variations, modifications, and alternatives. Such variations, modifications and alternatives should be understood to be also within the scope of the present invention. In this application, the terms interconnection plate and interconnection clip may be used interchangeably.

FIG. 1 illustrates a dual interconnection plates 10 of the present invention having a handling access area 2 appended to thus be shared between two interconnection plate segments plate segment-1 1a and plate segment-2 1b. As will be presently described, the handling access area 2 is provided to facilitate handling of the plate segment-1 1a and the plate segment-2 1b with a pick up tool during assembly operation, especially when the plate segments are too small to be reliably and accurately picked up and handled by themselves. Additionally, a plate registration feature 35a and a plate registration feature 35b are added near the junctures between the handling access area 2 and the two interconnection plate segments (more clearly shown in section A-A view of the dual interconnection plates 10).

FIG. 2 through FIG. 5 illustrate a present invention batch assembly process for four leadframe packages using a common base leadframe carrier frame and a number of staggered dual interconnection plates. A base leadframe carrier frame 20 is shown in FIG. 2 with four base leadframes 20a, 20b, 20c, 20d located thereon. In combination with a number of staggered dual interconnection plates 10, the shown section of base leadframe carrier frame 20 enables batch assembling of two dual die leadframe packages. Thus, the base leadframe 20a has a die pad 25a, the base leadframe 20b has a die pad 25b, the base leadframe 20c has a die pad 25c and the base leadframe 20d has a die pad 25d.

To match the plate registration features 35a and 35b of the dual interconnection plates 10, a base registration feature is added onto each base leadframe. Thus, the base leadframe 20a has an added base registration feature 30a, the base leadframe 20b has an added base registration feature 30b, the base leadframe 20c has an added base registration feature 30c and the base leadframe 20d has an added base registration feature 30d. To match the specific beam geometry of the plate registration features 35a and 35b as illustrated, the base registration feature 30a of base leadframe 20a is shaped and sized into a pair of ramped guiding tabs 32a, 34a. Likewise, the base registration feature 30b is shaped and sized into a pair of ramped guiding tabs 32b, 34b, etc. Furthermore, as can be seen from cross sectional views B-B and C-C, the ramped guiding tabs are tilted from vertical about the Y-axis. FIG. 3 illustrates the package in progress after a semiconductor die has been attached and bonded atop each die pad. Thus, for example, semiconductor die 26c has been bonded atop die pad 25c, etc.

FIG. 4 illustrates the package in progress after the three dual interconnection plates have been engaged and locked onto the base leadframe carrier frame 20 via their respective plate registration features 35a, 35b, 35c, 35d. As remarked before, handling access areas 2, 4 and 6 are provided to the three dual interconnection plates to facilitate their handling. More specifically, the plate registration feature 35a has been guided and locked between ramped guiding tabs 32a and 34a of the base registration feature 30a, the plate registration feature 35b has been guided and locked between ramped guiding tabs 32b and 34b of the base registration feature 30b, etc. Notice that all the associated interconnection plate segments (such as plate segment-1 1a and plate segment-2 1b of FIG. 1) of the three dual interconnection plates have been concomitantly self-aligned and attached to the semiconductor dies 26a, 26b, 26c, 26d as well. Now the interconnection plate segments 1a, 1b, can be bonded to their corresponding semiconductor dies. If so desired, the handling access areas 2, 4, 6 can be bonded to the base leadframe carrier frame 20 as well with, for example, a solder joint. As the interconnection plate segments 1a, 1b, can be three dimensionally formed, they can be made to adapt for elevation difference between the base leadframe carrier frame 20 and the semiconductor dies.

FIG. 5 and FIG. 5A illustrate the package in progress after certain electrodes of the semiconductor dies have been wire bonded to leads 64a, 64b, 64c, 64d. For example, a top corner electrode of the semiconductor die 26b can be connected to a terminal lead 64b via wire bond 50b for external electrical connection to leadframe package portion 80b, etc. It is pointed out that wire bonding, owing to its advantage of small size, can be used in lieu of plate bonding where its advantage of low interconnect impedance is not needed, such as the case of a gate electrode on a MOSFET die. A molding encapsulant 70 can now be formed over the package in progress for passivation. Afterwards, all base registration features, plate registration features and handling access areas can be cut away to form the leadframe package portion 80a, 80b, 80c, 80d having die pad leads 60a, 60b, 60c, 60d, plate segment leads 62a, 62b, 62c, 62d, and gate leads 64a, 64b, 64c, 64d. Notice the leadframe package portions 80a and 80b are oriented to be opposing each other referencing the handling access area 4. In this embodiment, leadframe portions 80a and 80c together form a dual die package 90, with trimmed leads as shown in the top view of FIG. 5A. Note that the plate segment leads 62a, 62c, are the portions of the plate segment-1 1a and plate segment-2 1b external to the molding encapsulant 70 that remain after trimming. The width of plate segment leads 62a, 62c, are approximately the same as where their respective leads attach to the semiconductor die. Due to the narrow width throughout the interconnection plate, the need for handling access areas should be apparent. Similarly, the leadframe package portions 80b and 80d together form another dual die package (not shown). It should be apparent that this invention could also be used for single die packages. Please note that while base leadframe carrier frame 20 can comprise a large number of leadframe package portions hosting a corresponding number of semiconductor dies, each dual interconnection plates 10 only bonds to two semiconductor dies. While this requires the use of several dual interconnection plates, it also facilitates the exact alignment of each interconnection plate to the corresponding semiconductor die, since each plate is locally aligned to the leadframe and semiconductor die, independently of other plates. This also allows standard clip tools (a mature technology) to be used to attach the clips to the semiconductor dies.

FIG. 6 illustrates an alternative dual interconnection plates 100 of the present invention wherein each interconnection plate member is appended with its own handling access area. Specifically, handling access area 102 is appended to plate segment-1 101a via a plate registration feature 135a while handling access area 104 is appended to plate segment-2 101b via a plate registration feature 135b. In turn, the handling access areas 102, 104 are integrated onto a plate carrier beam 106.

FIG. 7 through FIG. 9 illustrate a present invention batch assembly process for dual chip leadframe packages using a base leadframe carrier frame 120 and the dual interconnection plates 100 of FIG. 6 with additional wire bonds 150a, 150b. In FIG. 7 two semiconductor dies 26a, 26b have been bonded to their corresponding die pads on the base leadframe carrier frame 120. The two semiconductor dies 26a, 26b may be formed on a single dual die common drain chip. Notice that the base leadframe carrier frame 120 carries two base leadframes portions 120a, 120b with base registration features 130a, 130b located thereon. For external electrical connection, the base leadframe carrier frame 120 is configured with terminal leads 160a, 160b and ganged terminal leads 160g.

FIG. 8 illustrates the package in progress after the dual interconnection plates 100 have been engaged and locked onto the base leadframe carrier frame 120 via their respective registration features 135a, 135b, 130a, 130b. Similar to FIG. 4, all the associated interconnection plate segments 101a, 101b of the dual interconnection plates 100 have been concomitantly self-aligned and attached to the semiconductor dies 26a, 26b as well. Now the interconnection plate segments can be bonded to their corresponding semiconductor dies. If so desired, the handling access areas can be bonded to the base leadframe carrier frame 120 as well. The plate registration features 135a, 135b have a ridge shape which self-align and lock them into position onto the ramped and tilted base registration features 130a, 130b.

FIG. 9 illustrates the package in progress after certain electrodes of the semiconductor dies have been wire bonded to the base leadframe carrier frame 120. For example, a top corner electrode of the semiconductor die 26a can be connected to a terminal lead 160a via wire bond 150a for external electrical connection to the base leadframe 120a, etc. Although not specifically illustrated here to avoid unnecessary obscuring details, a molding encapsulant can now be formed over the package in progress for passivation. Afterwards, all base registration features, plate registration features and handling access areas can be cut away to form the dual die leadframe package.

FIG. 10 illustrates a quad interconnection plates 200 of the present invention wherein a common handling access area 202 is shared among four interconnection plate segments 201a, 201b, 201c, 201d respectively equipped with plate registration features 235a, 235b, 235c, 235d, 236a, 236b.

FIG. 11 through FIG. 13 illustrate a present invention batch assembly process for two single chip dual die leadframe packages using a base leadframe carrier frame 220 and the quad interconnection plates 200 with additional wire bonds 250a, 250b, 250c, 250d. In FIG. 11 two dual die semiconductor chips 26a, 26b have been bonded to their corresponding die pads on the base leadframe carrier frame 220. Notice that the base leadframe carrier frame 220 carries two base leadframes 220a, 220b with base registration features 230, 231a, 231b located thereon. For external electrical connection, the base leadframe carrier frame 220 is configured with terminal leads 260a, 260b, 260c, 260d and ganged terminal leads 260g, 260h.

FIG. 12 illustrates the package in progress after the quad interconnection plates 200 have been engaged and locked onto the base leadframe carrier frame 220 via their respective registration features 235a, 235b, 235c, 235d, 230, 231a, 231b. The registration features 235a, 235b, 235c, 235d interact with registration feature 230 in a similar manner as how the registration features 35a, 35b self-align with registration feature 41a of FIGS. 14A-14D. The plate registration features 236a and 236b have notches in them for self-aligning and locking into place with base registration features 231a and 231b. Similar to FIG. 4, all the associated interconnection plate segments 201a, 201b, 201c, 201d of the quad interconnection plates 200 have been concomitantly self-aligned and attached to the dual die semiconductor chips 26a, 26b as well. Now the interconnection plate segments can be bonded to their corresponding semiconductor dies. If so desired, the handling access area 202 can be bonded to the base leadframe carrier frame 220 as well.

FIG. 13 illustrates the package in progress after certain electrodes of the semiconductor dies have been wire bonded to the base leadframe carrier frame 220. For example, a top electrode of the semiconductor die 26a can be connected to a terminal lead 260a via wire bond 250a for external electrical connection through the base leadframe terminal lead 260a, etc. Although not specifically illustrated here to avoid unnecessary obscuring details, a molding encapsulant can now be formed over the package in progress for passivation. Afterwards, all base registration features, plate registration features and handling access areas can be cut away to form the two single chip dual die leadframe packages. The trimmed ends of interconnection plate segments 201a, 201b, 201c, 201d, form the terminal leads 262a, 262b, 262c, 262d.

FIG. 14A through FIG. 14D illustrate a process of self-aligned attachment of a dual interconnection plates 10 (of FIGS. 1-5) to a base registration feature X-Z cross section-1 41a along a first cross section A-A (see FIG. 2 and FIG. 4 for location of the base registration feature X-Z cross section-1 41a relative to the base leadframe carrier frame 20). In FIG. 14A a pick up tool 3 is approaching, along −Z direction, handling access area 2 of the dual interconnection plates 10 with the target base registration feature X-Z cross section-1 41a located to its right. As an example, the pick up tool 3 can be of a vacuum pick up type. In FIG. 14B the pick up tool 3 has mated onto the handling access area 2 and has transported the dual interconnection plates 10 over the base registration feature X-Z cross section-1 41a, albeit with an offset error to the right (+X direction). In FIG. 14C a downward motion of the pick up tool 3 has just effected an engagement of the plate registration feature 35a to a top corner of the base registration feature X-Z cross section-1 41a. As shown in FIG. 14A through FIG. 14D the plate registration features 35a, 35b, have portions ramped down with respect to the X-axis in the Z-direction. Upon further downward motion of the pick up tool 3 the ramped surface contour of the plate registration feature 35a, now maintained in sliding contact with the top corner of the base registration feature X-Z cross section-1 41a, then forces a simultaneous downward and side movement (−X direction) of the dual interconnection plates 10 until the two plate registration features 35a and 35b symmetrically capture the base registration feature X-Z cross section-1 41a in between thus completing the self-aligned attachment process, as shown in FIG. 14D.

In a manner similar to the above process, FIG. 15A through FIG. 15D illustrate a process of self-aligned attachment of the dual interconnection plates 10 to a base registration feature X-Z cross section-2 41b along a second cross section B-B (see FIG. 2 for location of the base registration feature X-Z cross section-2 41b relative to the base leadframe carrier frame 20), also with an initial offset error to the right (+X direction) upon first engagement of the plate registration feature 35b to a ramped upper surface of the base registration feature X-Z cross section-2 41b. As shown in FIG. 15A through FIG. 15D the base registration feature X-Z cross section-2 41b, has edges ramped with respect to the Z-axis in the X-directions. These ramped edges guide the handling access area 2 of the dual interconnection plates 10 to slide into the correct position. In this embodiment, the edges of handling access area 2 act as part of the plate registration features to interact with the base registration features for self-alignment. FIG. 15A through FIG. 15D are best understood in the context of cross sections of FIG. 16A through FIG. 16D, and FIG. 14A through FIG. 14D, and the perspective views of FIG. 1 through FIG. 5.

Similarly, FIG. 16A through FIG. 16D illustrate a process of self-aligned attachment of the dual interconnection plates 10 to a base registration feature Y-Z cross section-1 42 along a third cross section C-C (see FIG. 2 for location of the base registration feature Y-Z cross section-1 42 relative to the base leadframe carrier frame 20), albeit with an initial offset error to the right (−Y direction) upon first engagement of the plate registration feature 35d to a ramped upper surface of the base registration feature 34d of Y-Z cross section-1 42. As shown in FIG. 16A through FIG. 16D the ramped guiding tabs 32d, 34d, have edges ramped with respect to the Z-axis in the Y-directions. The ramped guiding tabs 32d, 34d, guide the plate registration feature 35d to its corrected position between the ramped guiding tabs 32d, 34d.

FIG. 17 illustrates the result of a present invention batch assembly process for four single chip dual die leadframe packages using a base leadframe carrier frame 20 and an interconnection plate carrier frame 22 with additional wire bonds 350a, 350b, 350c, 350d. Four semiconductor dies 326a, 326b, 326c, 326d have been bonded to their corresponding die pads on the base leadframe carrier frame 20 that in turn carries four base registration features 330a, 330b, 330c, 330d. Correspondingly, the interconnection plate carrier frame 22 carries four matching plate registration features 335a, 335b, 335c, 335d. The base registration features 330a, 330b, 330c, 330d are ramped with respect to the Z-axis in the X-directions, and have a wedge-shape profile in the Y-Z plane. The plate registration features 335a, 335b, 335c, 335d have openings to match and self-align with the base registration features 330a, 330b, 330c, 330d. Please note that the interconnection plate carrier frame 22 also carries four terminal leads for attaching the bond wires 350a, 350b, 350c, 350d to. As a refinement for further locking the various plate registration features and base registration features to each other, a base registration hole 340a and a plate registration hole 340b are made respectively on the base leadframe carrier frame 20 and the interconnection plate carrier frame 22. The two registration holes are designed to line up with each other upon attachment of the interconnection plate carrier frame 22 to the base leadframe carrier frame 20. Afterwards, as illustrated with a downward pointing arrow, a locking pin 342 can be inserted through the two registration holes to further lock the attachment in place. Please note that while the base leadframe carrier frame 20 may extend beyond what is shown in FIG. 17 to include more base leadframes, the interconnection plate carrier frame 22 is shown in its entirety in FIG. 17—multiple interconnection plate carrier frames 22 would be used to attach to a larger sheet of base leadframe carrier frame 20. Each interconnection plate unit 22 may thus be self aligned and attached locally and independently of other interconnection plate units.

As an example, the top view of FIG. 17A shows a singulated package 399 comprising a molding encapsulant 370 formed atop and around the semiconductor die 326b parts of the leadframe and interconnection plate. After the molding encapsulant 370 is formed, the leads are cut to singulate the package 399, with portions of the leads protruding from the molding encapsulant 370. The interconnection clip leads 363a and 363b are bonded to the top of semiconductor die 326b and were part of the interconnection plate carrier frame 22. The gate leads 362a and 362b are connected to portions of the semiconductor die 326b through bond wires 350b and were also part of the interconnection plate carrier frame 22 before singulation. The leads 365 are electrically connected to the bottom of semiconductor die 362b and were originally part of the base leadframe carrier frame 20 before singulation.

To those skilled in the art, by now it should become clear that, in addition to the specific geometries of base registration features and plate registration features illustrated above, the registration features can be designed with a large variety of other matched shapes and sizes to serve the same purpose of self-aligned attachment of interconnection plates to their corresponding semiconductor dies within a leadframe package. Some example shapes include round pins, round holes, square pins, square holes, cone-shaped pins, cone-shaped holes, spherical bumps, spherical cavities, spikes, wedges, etc. The geometric design for the base registration feature and the plate registration feature can be interchanged and modified as well. As another refinement, the base leadframe and the interconnection plate can be configured so that the base leadframe provides a first portion and the interconnection plate provides a second portion of the terminal leads. As another refinement, single interconnection plate can be used instead of a dual interconnection plates, for attaching to a single interconnection plate to a single semiconductor die at a time. As another refinement, multiple pickup tools can be used simultaneously to attach multiple clips to multiple dies. This can be performed using standard semiconductor packaging tools and requires no special equipment.

Regarding the heretofore disclosed handling access areas for facilitating the handling of interconnection plates, while they were illustrated as appendages to thus located away from the interconnection plates, it is pointed out that for those interconnection plates of sufficiently large size to accommodate a pick up tool the associated handling access area can be integrated into the main part of the interconnection plate as part of its built-in feature.

A method has been described for attaching an elevation-adaptive interconnection plate to a semiconductor die within a leadframe package by adding a base registration feature onto a base leadframe and adding a plate registration feature onto the interconnection plate such that the base registration feature and the plate registration feature are shaped and sized to match each other and to guide each other into the correct position. By now it should become clear to those skilled in the art that the numerous embodiments just described can be readily modified to suit other specific applications as well. While the description above contains many specificities, these specificities should not be constructed as accordingly limiting the scope of the present invention but as merely providing illustrations of numerous presently preferred embodiments of this invention. Any and all modifications that come within the meaning and range of equivalents within the claims are intended to be considered as being embraced within the spirit and scope of the present invention.

What is claimed are:

1. A method of attaching an elevation-adaptive interconnection plate to a semiconductor die within a leadframe package having a plurality of terminal leads for external electrical connection thereto, the method comprises:
   a) providing a base leadframe having a die pad for attaching the semiconductor die thereon and providing an interconnection plate for attachment to the base leadframe and the semiconductor die;
   b) adding a base registration means onto the base leadframe and adding a plate registration means, matching the base registration means, onto the interconnection plate such that, upon an approach of the interconnection plate to the base leadframe with the semiconductor die attached thereon, the plate registration means and the base registration means would engage and guide each other causing a concomitant self-aligned attachment of the interconnection plate to the base leadframe and the semiconductor die;
   c) attaching and bonding the semiconductor die atop the die pad; and
   d) bringing the interconnection plate into close approach to the base leadframe to engage and lock plate registration means and base registration means to each other hence completing attachment of the interconnection plate to the semiconductor die whereby forming a leadframe package.

2. The method of claim 1 further comprises bonding the interconnection plate to the semiconductor die.

3. The method of claim 2 further comprises wire bonding a number of pre-determined electrodes of the semiconductor die to the terminal leads.

4. The method of claim 2 further comprises forming a molding encapsulant over the package in progress for passivation.

5. The method of claim 2 further comprises bonding the plate registration means onto the base registration means.

6. The method of claim 5 wherein bonding the plate registration means onto the base registration means further comprises bonding them with a solder joint.

7. The method of claim 4 further comprises cutting away both base registration means and plate registration means from the leadframe package.

8. The method of claim 7 wherein bringing the interconnection plate further comprises providing a interconnection plate such that after cutting away both base registration means and plate registration means from the leadframe package, the leadframe package has leads formed from said interconnection plate.

9. The method of claim 8 wherein bringing the interconnection plate further comprises providing a interconnection plate such that said leads formed from said interconnection plate are approximately the same width as where the interconnection plate connects to the semiconductor die.

10. The method of claim 8 wherein bringing the interconnection plate further comprises providing a handling access area thereon of sufficient size such that the interconnection plate can be handled with a pick up tool engaging the handling access area.

11. The method of claim 1 wherein bringing the interconnection plate into close approach to the base leadframe further comprises bringing multiple interconnection plate units into close approach to the base leadframe, so that each interconnection plate unit may locally and independently engage and self-align with the base leadframe.

12. The method of claim 1 wherein providing a base leadframe further comprises providing a plurality of base leadframes on a common base leadframe carrier frame.

13. The method of claim 12 wherein bringing the interconnection plate into close approach to the base leadframe further comprises bringing multiple interconnection plate units into close approach to the common base leadframe carrier frame, so that each interconnection plate unit may locally and independently engage and self-align with the base leadframe.

14. The method of claim 1 wherein bringing the interconnection plate further comprises providing a handling access area thereon of sufficient size such that the interconnection plate can be handled with a pick up tool engaging the handling access area.

15. The method of claim 1 wherein, to facilitate handling of small sized interconnection plate, bringing the interconnection plate further comprises appending a separate handling access area of sufficient size to the interconnection plate such that the small sized interconnection plate can be handled with the tip of a pick up tool engaging the separate handling access area.

16. The method of claim 15, wherein the leadframe package is batch fabricated in multiple units on a common carrier frame, appending the separate handling access area further comprises sharing each handling access area among at least two leadframe package units on the common carrier frame.

17. The method of claim 16 wherein sharing each handling access area further comprises sharing it among two leadframe package units by orienting the two leadframe packages so they oppose each other referencing the handling access area.

18. The method of claim 15 further comprises cutting away the separate handling access area from the leadframe package.

19. The method of claim 1 wherein bringing the interconnection plate into close approach to the base leadframe further comprises:
   d1) making a base registration hole and a plate registration hole respectively on the base leadframe and the interconnection plate such that, upon attachment of the interconnection plate to the base leadframe, the two registration holes would line up with each other; and
   d2) upon attachment of the interconnection plate to the base leadframe, inserting a locking pin into the two registration holes to further lock the attachment in place.

20. The method of claim 1 wherein providing the base leadframe further comprises providing the plurality of terminal leads.

21. The method of claim 1 wherein providing the base leadframe further comprises providing a first portion of the plurality of terminal leads and providing the interconnection plate further comprises providing a second portion of the plurality of terminal leads.

* * * * *